United States Patent
Woo et al.

(10) Patent No.: US 8,125,617 B2
(45) Date of Patent: Feb. 28, 2012

(54) APPARATUS AND METHOD FOR MANUFACTURING SEMICONDUCTOR DEVICE

(75) Inventors: Sang-Yoon Woo, Seoul (KR); Yong-Jin Cho, Suwon-si (KR); Seok-Hwan Oh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 523 days.

(21) Appl. No.: 12/292,731

(22) Filed: Nov. 25, 2008

(65) Prior Publication Data
US 2009/0147225 A1 Jun. 11, 2009

(30) Foreign Application Priority Data
Dec. 7, 2007 (KR) .................. 10-2007-0126779

(51) Int. Cl.
G03B 27/60 (2006.01)
G03B 27/52 (2006.01)
(52) U.S. Cl. ........................... 355/73; 355/55
(58) Field of Classification Search ............ 355/53, 355/27, 73, 55
See application file for complete search history.

(56) References Cited

U.S. PATENT DOCUMENTS
2003/0061725 A1* 4/2003 Riley et al. ............... 34/236
2006/0238721 A1* 10/2006 Kate et al. ............... 353/53
2007/0081136 A1 4/2007 Hara

FOREIGN PATENT DOCUMENTS
| JP | 2006-173295 | 6/2006 |
| JP | 2007-053329 | 3/2007 |
| JP | 2007-115730 | 5/2007 |
| KR | 10-2006-0132690 | 12/2006 |

* cited by examiner

*Primary Examiner* — Hung Henry Nguyen
*Assistant Examiner* — Michelle Iacoletti
(74) *Attorney, Agent, or Firm* — Harness, Dickey & Pierce

(57) ABSTRACT

An apparatus for manufacturing a semiconductor device and a method for manufacturing a semiconductor device using the apparatus may be provided. The manufacturing apparatus may include a liquid supplying portion for forming a liquid film, and a gas supplying unit that may rotate to discharge gas at a wide range of angles. The manufacturing method may include forming a shape and size of a liquid film common to the shape and size of an exposure region through adjusting the direction and pressure in which gas may be discharged to the substrate. Thus, the speed at which a substrate may be moved may be increased, and morphology differences of a substrate may be reduced.

14 Claims, 9 Drawing Sheets

APPARATUS AND METHOD FOR MANUFACTURING SEMICONDUCTOR DEVICE

PRIORITY STATEMENT

This U.S. non-provisional patent application claims the benefit of priority under 35 U.S.C. §119 to Korean Patent Application No. 10-2007-0126779, filed on Dec. 7, 2007, the entire contents of which are hereby incorporated by reference.

BACKGROUND

1. Field

Example embodiments relate to an apparatus for manufacturing a semiconductor device, and a method for manufacturing a semiconductor device using the apparatus.

2. Description of Related Art

Semiconductor device manufacturing may include a photolithography process for integrating a plurality of components into a semiconductor device. A photolithography process may employ a photoresist to form a required pattern. For example, the dimensions of a semiconductor device pattern may rely on the resolution of a photolithography process. As semiconductor devices require higher degrees of integration, photolithography processes capable of realizing superior resolution may be needed.

The resolution in a photolithography process may be determined by Rayleigh's equation: $R=k\lambda/NA$. Here, k may be a resolution factor, $\lambda$ may be a wavelength of the exposing radiation, and NA (numerical aperture) may be an effective aperture of a lens. Accordingly, the smaller the resolution factor and wavelength of the exposing radiation may be, and the greater the numerical aperture may be, the finer patterns may be formed.

To form miniature patterns, a short wavelength of the exposing radiation may be used. For example, wavelengths of the exposing radiation of 248 nm krypton fluoride (KrF) or 193 nm argon fluoride (ArF) may be used.

Also, in order to form miniature patterns, the numerical aperture of a lens may be increased. The effective aperture of a lens, for example, the NA, may correspond to $n \cdot \sin\theta$. Here, n may be the refractive index of the medium between the lens and photoresist, and $\theta$ may be the acceptance angle. Accordingly, the higher the refractive index of the medium, the higher the resolution may be in a photolithography process. In general, an exposure in a photolithography process may be performed under atmospheric conditions. For example, air, with a refractive index of 1.0 may be used as a medium for exposing radiation between a light source and a photoresist. However, as design rules may be reduced, the use of air as a medium in photolithography processes to form more miniaturized patterns may have limitations. Thus, in order to overcome resolution limitations, immersion lithography has been introduced.

In immersion lithography processes, water, organic solvents and other liquids having a refractive index of 1.0 or higher may be used as a medium between a light source and a photoresist. Accordingly, the NA of a lens in an immersion lithography process may be increased versus that in a typical photolithography process. For example, resolution may be raised through reducing a wavelength of incident light from an original value to a smaller value. However, immersion lithography processes may involve limitations brought about by a liquid residing for a prolonged period on a substrate.

SUMMARY

An embodiment of the present invention may provide an apparatus for manufacturing a semiconductor device and a method using the apparatus to manufacture a semiconductor device that may reduce differences in characteristics between semiconductor devices.

An embodiment of the present invention may provide apparatuses for manufacturing a semiconductor device including a projection lens, a liquid supplying portion proximate to the projection lens, the liquid supplying portion forming a liquid film on a substrate facing the projection lens, and a gas supplying unit proximate to the liquid supplying portion. The gas supplying unit may adjust a shape and a size of the liquid film.

According to an embodiment, the gas supplying unit may adjust at least one of the shape and the size of the liquid film to correspond to a shape and size of an exposure region of the substrate.

According to an embodiment, the liquid supplying portion and the gas supplying unit may be included in a common unitary apparatus, and the gas supplying unit may enclose a periphery of the projection lens.

According to an embodiment, the liquid supplying portion and the gas supplying unit may be included in mutually different unitary apparatuses. For example, the liquid supplying portion may be mounted at a side surface of the projection lens and the gas supplying unit may enclose a periphery of the projection lens.

According to an embodiment, the gas supplying unit may face the substrate and rotate upon an angular range from about 0° to 90° in relation to a surface of the projection lens.

According to an embodiment, the gas supplying unit may include an air knife.

According to an embodiment, a shape of the gas supplying unit may correspond to a shape of an exposure region of the substrate.

According to an embodiment, a shape of the liquid supplying portion may correspond to a shape of an exposure region of the substrate.

According to an embodiment, the apparatus may further include a projection optical system including the projection lens, a light source supplying light to the projection optical system, and a reticle stage interposed between the light source and the projection optical system.

According to an embodiment, the apparatus may further include an exposure portion comprising the light source, the reticle stage, and the projection optical system, a coating portion connected to the exposure portion, and a developing portion connected to the exposure portion. For example, the apparatus may include the liquid supplying portion, and/or the gas supplying unit According to an embodiment, apparatuses for manufacturing a semiconductor device may include a projection lens, a liquid supplying portion having a first shape, and a gas supplying unit having a second shape. For example, the liquid supplying portion may include a liquid inlet and a liquid outlet and a gas supplying unit may include at least one air knife.

According to an embodiment, the first shape and the second shape correspond to a shape of an exposure region of the substrate.

According to an embodiment, the first shape and the second shape are the same.

According to an embodiment, the first shape is circular.
According to an embodiment, the first shape is rectangular.

BRIEF DESCRIPTION OF THE FIGURES

The above and/or other features and advantages will become more apparent and more readily appreciated from the detailed description of embodiments of the present invention thereof with reference to the attached drawings in which.

DETAILED DESCRIPTION OF EXAMPLE EMBODIMENTS

Example embodiments of the present invention will now be described below in more detail with reference to the accompanying drawings. Example embodiments may be in different forms and should not be construed as limited to the embodiments set forth herein. Rather, these embodiments are provided so that this disclosure will be thorough and complete, and will fully convey the scope to those skilled in the art. Like reference numerals in the drawings denote like elements, and thus, their description may not be repeated.

It will also be understood that when a conductive layer, semiconductor layer, insulating layer, or any other material layer is referred to as being 'on' another material layer or substrate, the material layer may be directly on the other material layer or substrate, or other intervening material layers may also be present. In the figures, the dimensions of layers and regions are exaggerated for clarity of illustration. Also, while terms such as 'first', 'second', and 'third' are used to describe various regions, materials, etc. in example embodiments, such regions, materials, etc. are not limited by these terms. These terms are used to discriminate a certain portion from another portion. Therefore, a portion referred to as a first portion in one embodiment may be referred to as a second portion in another embodiment.

Example embodiments of the present invention will be more clearly understood from the detailed description taken in conjunction with the accompanying drawings.

In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality and/or acts involved.

Also, the use of the words "compound," "compounds," or "compound(s)," refer to either a single compound or to a plurality of compounds. These words are used to denote one or more compounds but may also just indicate a single compound.

Now, in order to more specifically describe example embodiments of the present invention, various embodiments of the present invention will be described in detail with reference to the attached drawings. However, the present invention is not limited to the example embodiments, but may be embodied in various forms. In the figures, if a layer is formed on another layer or a substrate, it means that the layer is directly formed on another layer or a substrate, or that a third layer is interposed therebetween. In the following description, the same reference numerals denote the same elements.

Although the example embodiments of the present invention have been disclosed for illustrative purposes, those skilled in the art will appreciate that various modifications, additions and substitutions are possible, without departing from the scope and spirit of the invention as disclosed in the accompanying claims.

Figure 1:
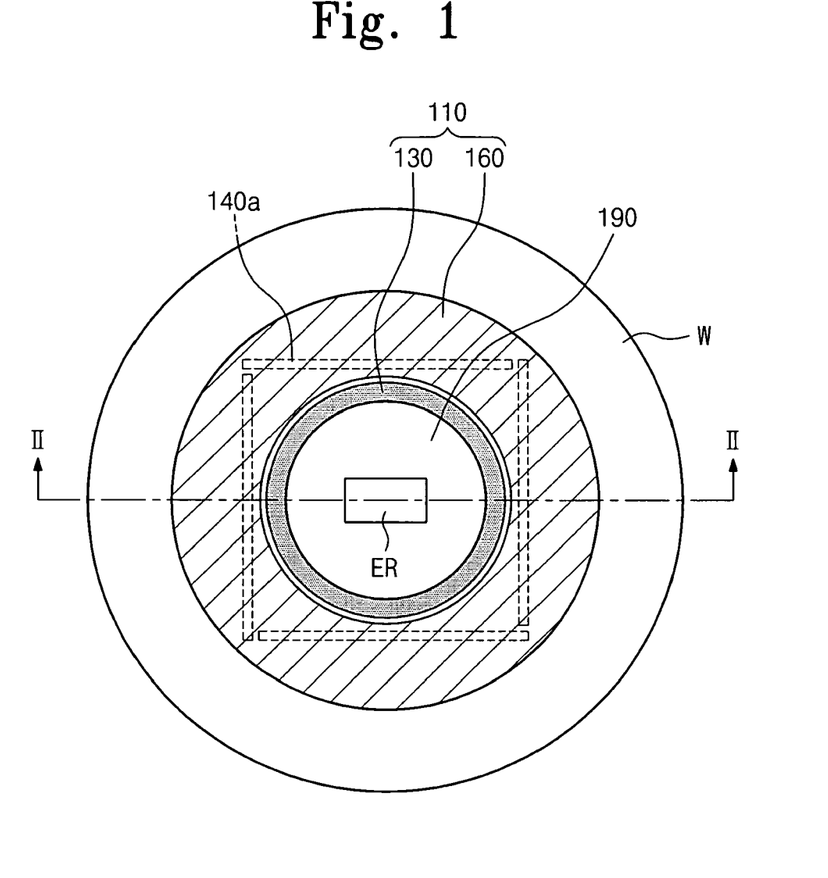
FIG. 1 illustrates a semiconductor device manufacturing apparatus according to an embodiment of the present invention.
Figure 2:
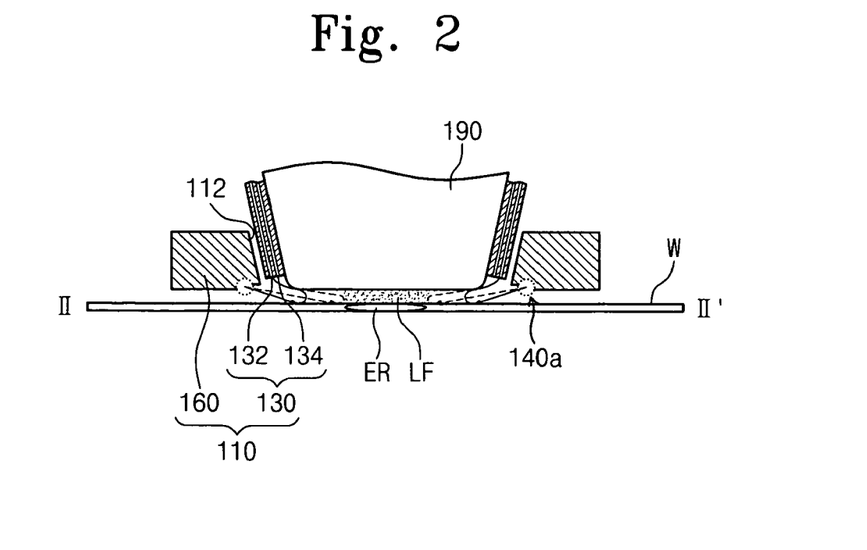
FIG. 2 is a sectional view of FIG. 1 taken along line II-II'.
Figure 3:
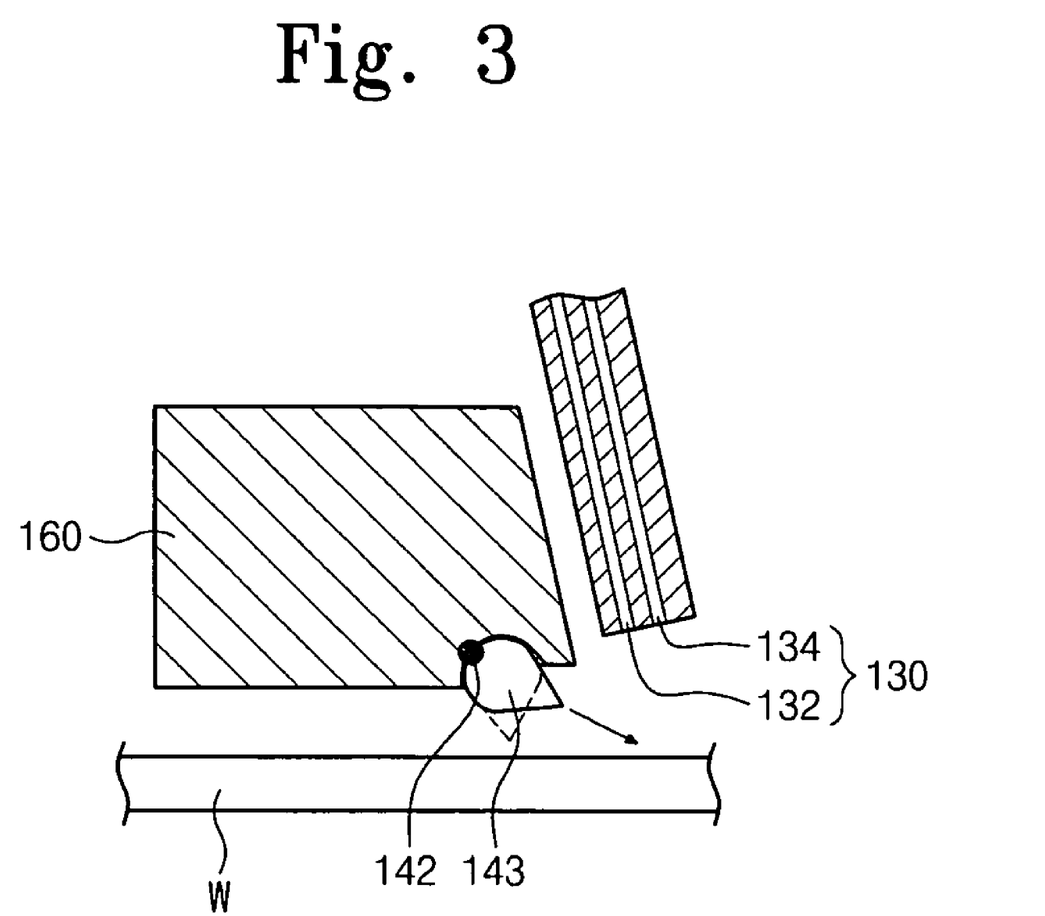
FIG. 3 is an example schematic enlarged view of a portion of FIG. 2.

FIG. 1 illustrates a semiconductor device manufacturing apparatus according to an embodiment of the present invention. FIG. 2 is a sectional view of FIG. 1 taken along line II-II' and according to an example embodiment, FIG. 3 may be a schematic enlarged view of a portion of FIG. 2;

Referring to FIGS. 1 through 3, an exposure apparatus unit 110 is provided. The exposure apparatus unit 110 may be a unitary apparatus for forming a liquid film on a substrate. The exposure apparatus unit 110 may include a first unit 130 and a second unit 160. The second unit 160 may have an open portion 112 in which a projection lens 190 is disposed. The open portion 112 may be formed in a common shape as the outer perimeter of the projection lens 190. For example, the open portion 112 may be circular. The second unit 160 may be spaced apart from a substrate (W) by a desired distance (or, alternatively a predetermined distance) and disposed above the substrate (W). Also, the projection lens 190 may be disposed within the open portion 112 to face the substrate (W) by a desired distance (or, alternatively a predetermined distance). A liquid film (LF) may fill between the projection lens 190 and the substrate (W). The substrate (W) may have an exposure region (ER), and the LF may be formed larger than the ER.

The projection lens 190 may be enclosed by a lens housing (not shown) that protects the outside of the projection lens 190. The first unit 130 may be disposed adjacent to the side surface of the projection lens 190 (protected by the lens housing) that faces the substrate (W). Here, the first unit 130 may be attached at the side surface of the projection lens 190 to be disposed along the side surface of the projection lens 190. The first unit 130 may include a liquid inlet 132 and a liquid outlet 134. A liquid may be provided onto the substrate (W) through the liquid inlet 132 and may be removed from the substrate (W) through the liquid outlet 134 to the outside. The quantity of liquid on a substrate may be controlled by the first unit 130. For example, the liquid inlet 132 may be disposed along the side surface of the projection lens 190, and the liquid outlet 134 may enclose the liquid inlet 132. Alternately, the liquid outlet 134 may be disposed along the side surface of the projection lens 190, and the liquid inlet 132 may enclose the liquid outlet 134. For example, the liquid outlet 134 and the liquid inlet 132 may enclose the side surface of the projection lens 190 in alternating disposition, so that the liquid outlet 134 and the liquid inlet 132 may not be overlapped each other. The first unit 130 may be connected to a liquid moving portion (not shown), and the liquid moving portion may be connected to an external liquid tank (not shown).

The second unit 160 may include a gas supplying unit 140a. The gas supplying unit 140a may have a shape common to the ER of the substrate (W)—for example, a rectangular shape. In the exposure process, the ER may be a one shot exposure region that may be exposed to a light source at one time of the exposure. For example, the gas supplying unit 140a may be disposed on a bottom of the second unit 160 adjacent to the open portion 112. For example, a portion of the gas supplying unit 140a may be disposed at a boundary portion where the opening 112 and the bottom of the second unit 160 meet. As illustrated in FIG. 3, the gas supplying unit 140a may include four air knives 143, rotating shafts 142 fastened to the air knives 143, respectively, and a rotating driver (not shown) connected to the rotating shafts 142. The air knives 143 may be separated from each other, and rotated by the rotating shafts 142, respectively. The air knives 143 of the gas supplying unit 140a may be rotated using the rotating shafts 142 as centers of rotation within an angle ranging from about 0° to about 90° from the surface of the projection lens 190 facing the substrate (W). Thus, the gas supplying unit 140a may supply gas to the substrate (W) at various angles and the shape and size of the liquid film (LF) may be controlled using the gas supplied from the gas supplying unit 140a (by adjusting variables such as gas pressure and supplying angle). For example, if the angle from the surface of the projection lens 190 to the gas supplying unit 140a (depicted by the dotted line with arrowhead in FIG. 2) is small, the size of the LF may be comparatively small. For example, if the angle of the gas supplying unit 140a (depicted by a solid line with arrowhead in FIG. 2) is large, the size of the LF may be comparatively large. By controlling the shape and size of the LF, the range of overlap between the substrate (W) and the LF may be adjusted. A gas outlet (not shown) may be further provided inside the second unit 160. The air knives 143 may be connected to external gas tanks (not shown). Wires electrically connecting the rotating shafts 142 to rotating driver (not shown) may be built in the second unit 160. Also, a pressure regulator (not shown) may be provided between the air knives 143 and the gas tanks to regulate the pressure at which gas may be supplied.

Figure 4:
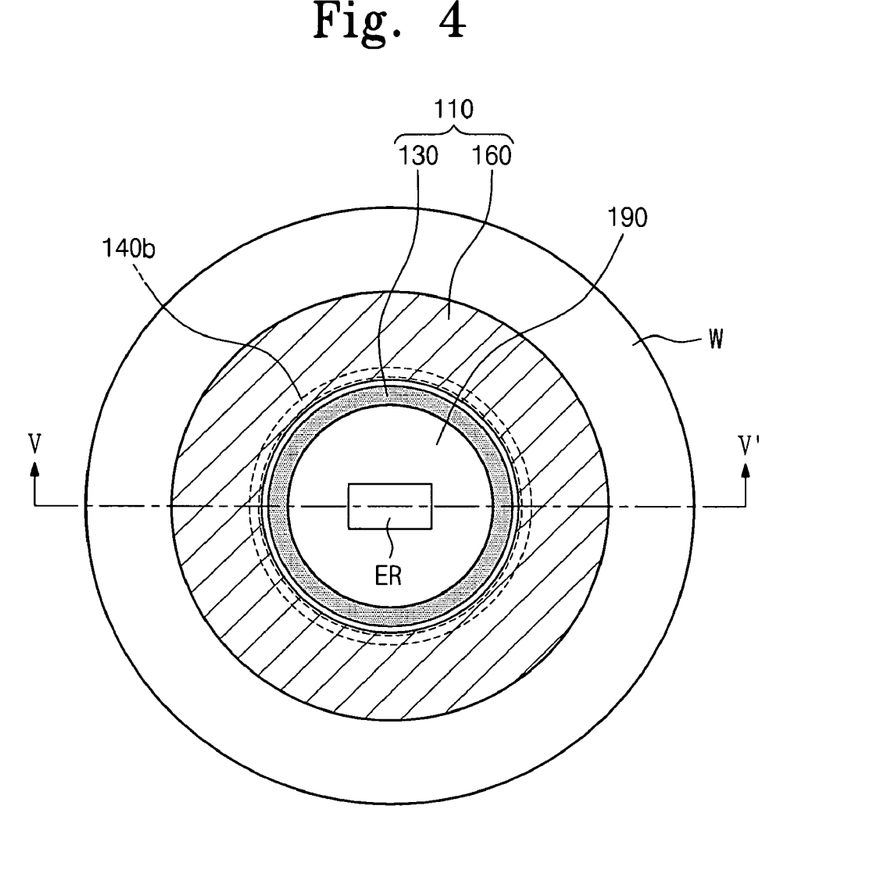
FIG. 4 illustrates a semiconductor device manufacturing apparatus according to an embodiment of the present invention.
Figure 5:
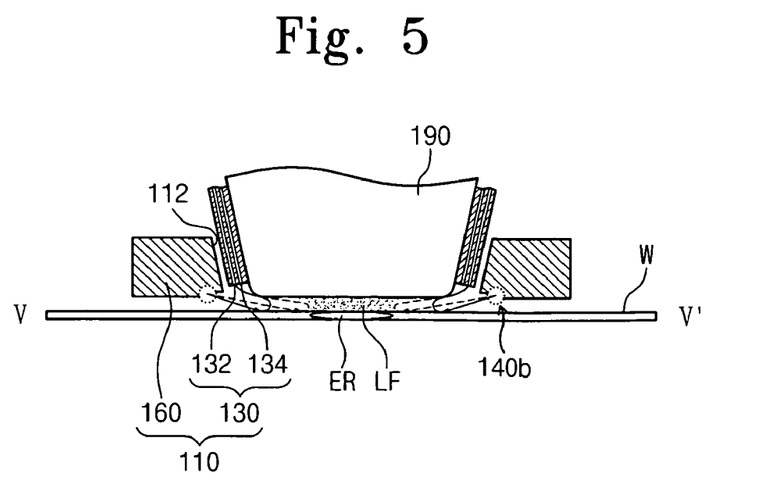
FIG. 5 is a sectional view of FIG. 4 taken along line V-V'.

FIG. 4 illustrates a semiconductor device manufacturing apparatus according to an embodiment of the present invention. FIG. 5 is a sectional view of FIG. 4 taken along line V-V'.

Referring to FIGS. 4 through 5, exposure apparatus units according to an embodiment of the present invention may be described. The embodiments in FIGS. 4 through 5 may include a gas supplying unit 140b of different configurations than those of embodiments in FIGS. 1 through 3. Below, content that may be similar to the embodiments illustrated in FIGS. 1 through 3 may not be described again or may be briefly described.

The second unit 160 may include a gas supplying unit 140b. The gas supplying unit 140b may be disposed proximate to the open portion 112 and may have a common shape (circle, for example) as the open portion 112. For example, the gas supplying unit 140b may be disposed at the boundary where the open portion 112 and the bottom of the second unit 160 meet, or may be disposed on the bottom of the second unit 160 adjacent to the open portion 112. As with the embodiment of FIGS. 1-3, the gas supplying unit 140b in the embodiment of FIGS. 4-5 may include a plurality of air knives 143 such as shown in FIG. 3. Rotating shafts 142 are fastened to the air knives 143, respectively, and a rotating driver (not shown) is connected to the rotating shafts 142. The air knives 143 may be separate from each other and rotated by the rotating shafts 142, respectively. For example, the number of air knives 143 may be determined by dividing the circumference of the gas supplying unit 140b into equal parts. The air knives 143 of the gas supplying unit 140b may be rotated using the rotating shafts 142 as centers of rotation within an angle ranging from about 0° to about 90° from the surface of the projection lens 190. Thus, the gas supplying unit 140b may supply gas to the substrate (W) at various angles and the shape and size of the liquid film (LF) may be controlled by the gas supplied from the gas supplying unit 140b (through adjusting variables such as gas pressure and supplying angle). By controlling the shape and size of the LF, the range of overlap between the substrate (W) and the LF maybe adjusted. A gas outlet (not shown) may be further provided inside the second unit 160. The air knives 143 may be connected to external gas tanks (not shown). Wires electrically connecting the rotating shafts 142 to rotating driver (not shown) may be built in the second unit 160. Also, a pressure regulator (not shown) may be provided between the air knives 143 and the gas tanks to regulate the pressure at which gas may be supplied.

Figure 6:
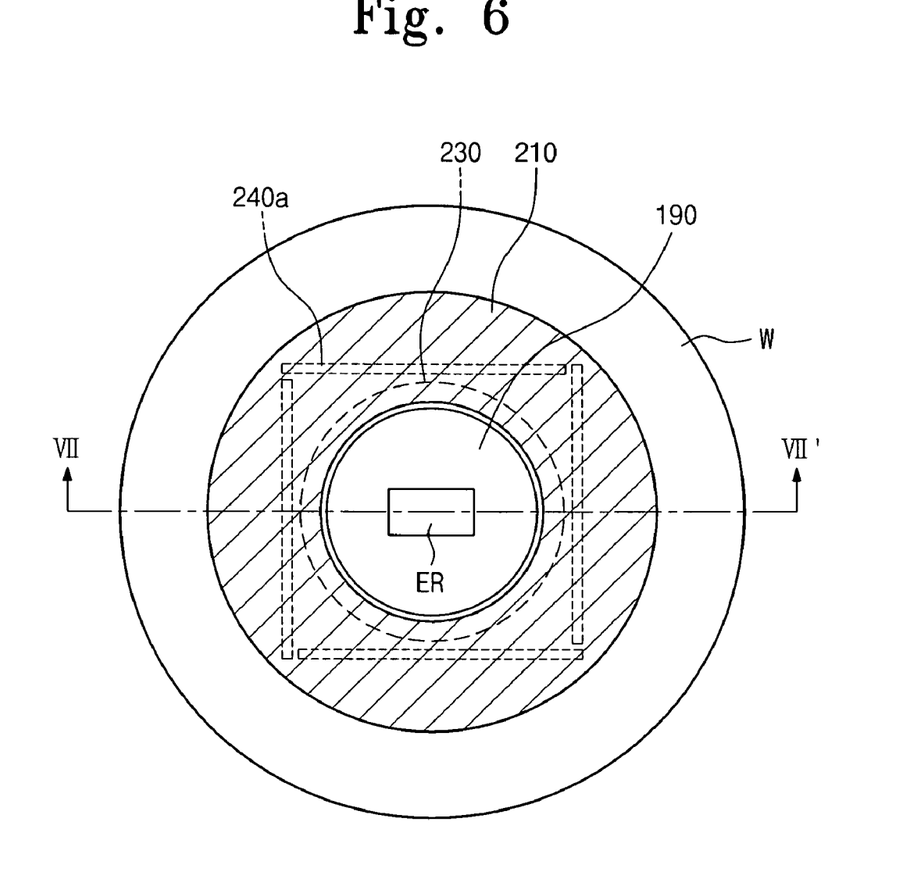
FIG. 6 illustrates a semiconductor device manufacturing apparatus according to an embodiment of the present invention.
Figure 7:
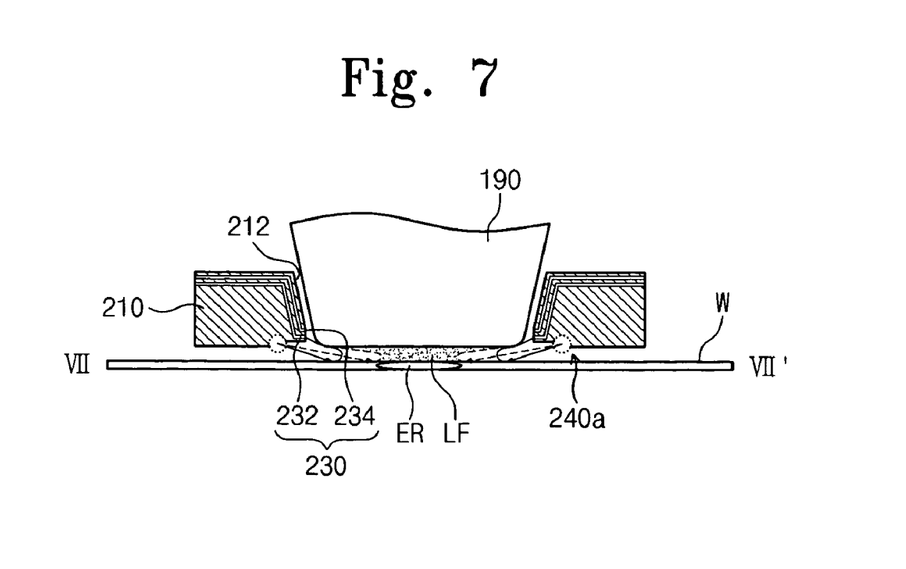
FIG. 7 is a sectional view of FIG. 6 taken along line VII-VII'.

FIG. 6 illustrates a semiconductor device manufacturing apparatus according to an embodiment of the present invention. FIG. 7 is a sectional view of FIG. 6 taken along line VII-VII'. According to an embodiment, FIG. 8 may be a schematic enlarged view of a portion of FIG. 7.

Figure 8:
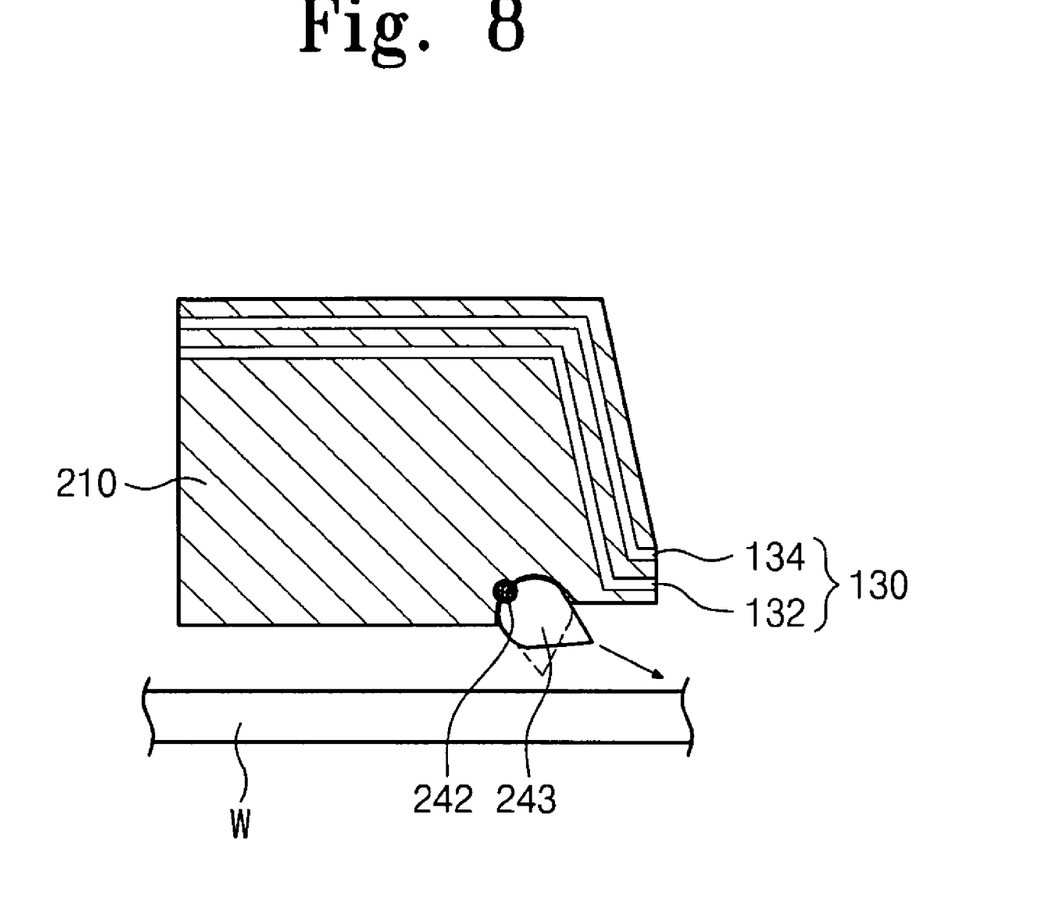
FIG. 8 is a schematic enlarged view of a portion of FIG. 7.

Referring to FIGS. 6 through 8, a liquid film (LF) forming unit 210 may be provided. The LF forming unit 210 may include an open portion 212 at which a projection lens 190 may be disposed. The open portion 212 may have a common shape as the outer shape of the projection lens 190 (for example, a circular shape). The LF forming unit 210 may be disposed above and spaced apart from a substrate (W) by a desired (or alternatively, a predetermined) distance. Also, the projection lens 190 may be disposed within the open portion 212 to face the substrate (W) in a desired (or alternatively, a predetermined) distance. A liquid film (LF) may fill between the projection lens 190 and the substrate (W).

The LF forming unit 210 may include a liquid supplying portion 230 and a gas supplying unit 240a. The liquid supplying portion 230 may surround the open portion 212 within the exposure apparatus unit 210. The liquid supplying portion 230 may include a liquid inlet 232 and a liquid outlet 234. For example, the liquid inlet 232 and the liquid outlet 234 may be exposed at a side surface of the open portion 212. More than one liquid inlet 232 and more than one liquid outlet 234 may be provided. Liquid may be provided through the liquid inlet 232 onto the substrate (W), and may be discharged from the substrate (W) to the outside through the liquid outlet 234. Thus, the quantity of liquid residing on a substrate may be controlled with the liquid supplying portion 230. For example, the liquid outlet 234 may be disposed higher at a side surface of the open portion 212 than the liquid inlet 232, or may be disposed lower than the liquid inlet 232. If the liquid outlet 234 and the liquid inlet 232 are positioned at a common height on the side surface of the open portion 212, the liquid outlet 234 and the liquid inlet 232 may be disposed alternatively to avoid the discharging and admitting routes for liquid from overlapping each other. The liquid supplying portion 230 may be connected to a liquid moving portion (not shown), and the liquid moving portion may be connected to an external liquid tank.

Figure 9:
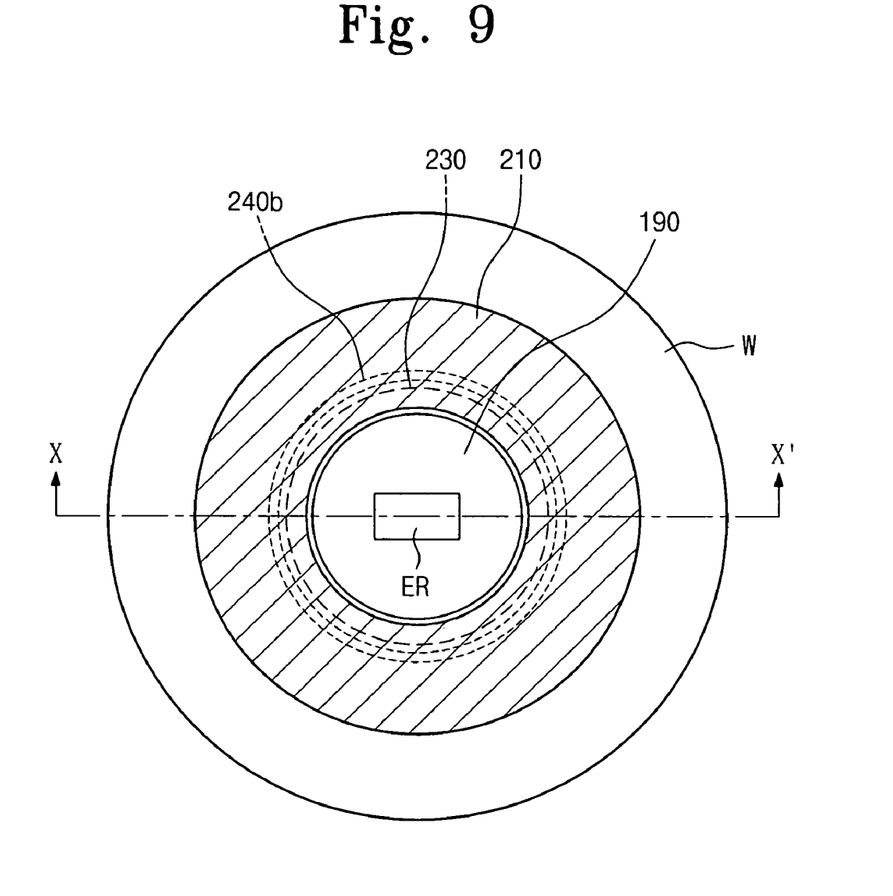
FIG. 9 illustrates a semiconductor device manufacturing apparatus according to an embodiment of the present invention.
Figure 10:
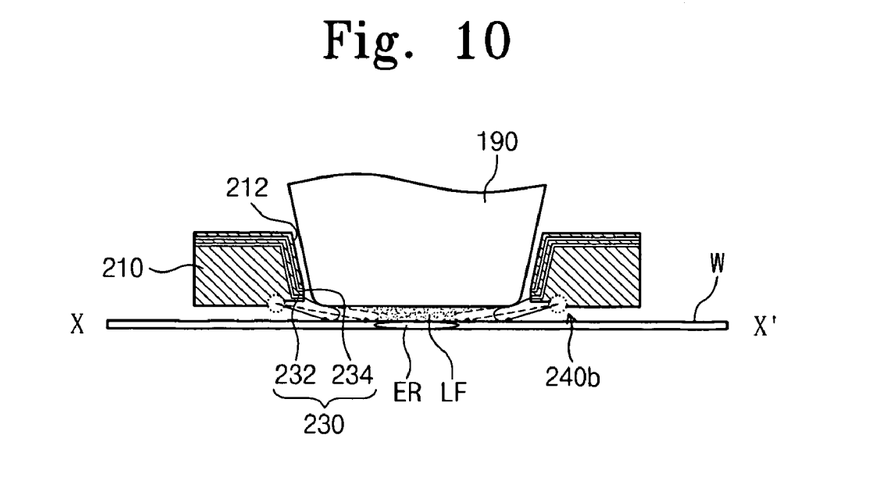
FIG. 10 is a sectional view of FIG. 9 taken along line X-X'.

The gas supplying unit 240a may have a common shape as an exposure region (ER) of the substrate (W)—for example, a rectangular shape. For example, the ER may be a one shot exposure region exposed to a light source at one time of the exposure. Also, the gas supplying unit 240a may be disposed on a bottom of the exposure apparatus unit 210 adjacent to the open portion 212. The gas supplying unit 240a may include four air knives 243, rotating shafts 242 fastened to the air knives 243, respectively, and a rotating driver (not shown) connected to the rotating shafts 242, as illustrated in FIG. 8. The air knives 243 may be separated from each other and rotated by the rotating shafts 242, respectively. The air knives 243 of the gas supplying unit 240a may be rotated using the rotating shafts 242 as centers of rotation within an angle ranging from about 0° to about 90° from the surface of the projection lens 190. Thus, the gas supplying unit 240a may supply gas to the substrate (W) at various angles and the shape and size of the liquid film (LF) may be controlled by the gas supplied from the gas supplying unit 240a (through adjusting variables such as gas pressure and supplying angle). By controlling the shape and size of the LF, the range of overlap between the substrate (W) and the LF may be adjusted. A gas outlet (not shown) may be further provided inside the exposure apparatus unit 210. The air knives 243 may be connected to external gas tanks (not shown). Wires electrically connecting the rotating shafts 242 and rotating driver (not shown) may be built into the exposure apparatus unit 210. Also, a pressure regulator (not shown) may be provided between the air knives 243 and the gas tanks to regulate the pressure at which gas may be supplied. FIG. 9 illustrates a semiconductor device manufacturing apparatus according to an embodiment of the present invention. FIG. 10 is a sectional view of FIG. 9 taken along line X-X'.

Referring to FIGS. 9 through 10, example embodiments may include a differently configured gas supplying unit 240b than those of example embodiments in FIGS. 6 through 8. Below, content that may be somewhat similar to embodiments illustrated in FIGS. 6 through 8 may not be described again or may be briefly described.

An exposure apparatus unit 210 may include a gas supplying unit 240b. The gas supplying unit 240b may be disposed proximate to the open portion 212 of the exposure apparatus unit 210 and may have a common shape (circular, for example) as the open portion 212. For example, the gas supplying unit 240b may be disposed on the bottom of the exposure apparatus unit 210 adjacent to the open portion 212. As with the embodiments of FIGS. 6-8, the gas supplying unit 240b in the embodiment of FIGS. 9-10 may include a plurality of air knives 243. Rotating shafts 242 are fastened to the air knives 243, respectively, and a rotating driver (not shown) is connected to the rotating shafts 242. The air knives 243 may be separate from each other and rotated by the rotating shafts 242, respectively. For example, the number of air knives 243 may be determined by dividing the circumference of the gas supplying unit 240b into equal parts. The air knives 243 of the gas supplying unit 240b may be rotated using the rotating shafts 242 as centers of rotation within an angle ranging from about 0° to about 90° from the surface of a projection lens 250. Thus, the gas supplying unit 240b may supply gas to the substrate (W) at various angles and the shape and size of the liquid film (LF) may be controlled by the gas supplied from the gas supplying unit 240b (through adjusting variables such as gas pressure and supplying angle). By controlling the shape and size of the LF, the range of overlap between the substrate (W) and the LF may be adjusted. A gas outlet (not shown) may be further provided inside the exposure apparatus unit 210. The air knives 243 may be connected to external gas tanks (not shown). Wires electrically connecting the rotating shafts 242 and rotating driver (not shown) may be built into the exposure apparatus unit 210. Also, a pressure regulator (not shown) may be provided between the air knives 243 and the gas tanks to regulate the pressure at which gas may be supplied.

Figure 11:
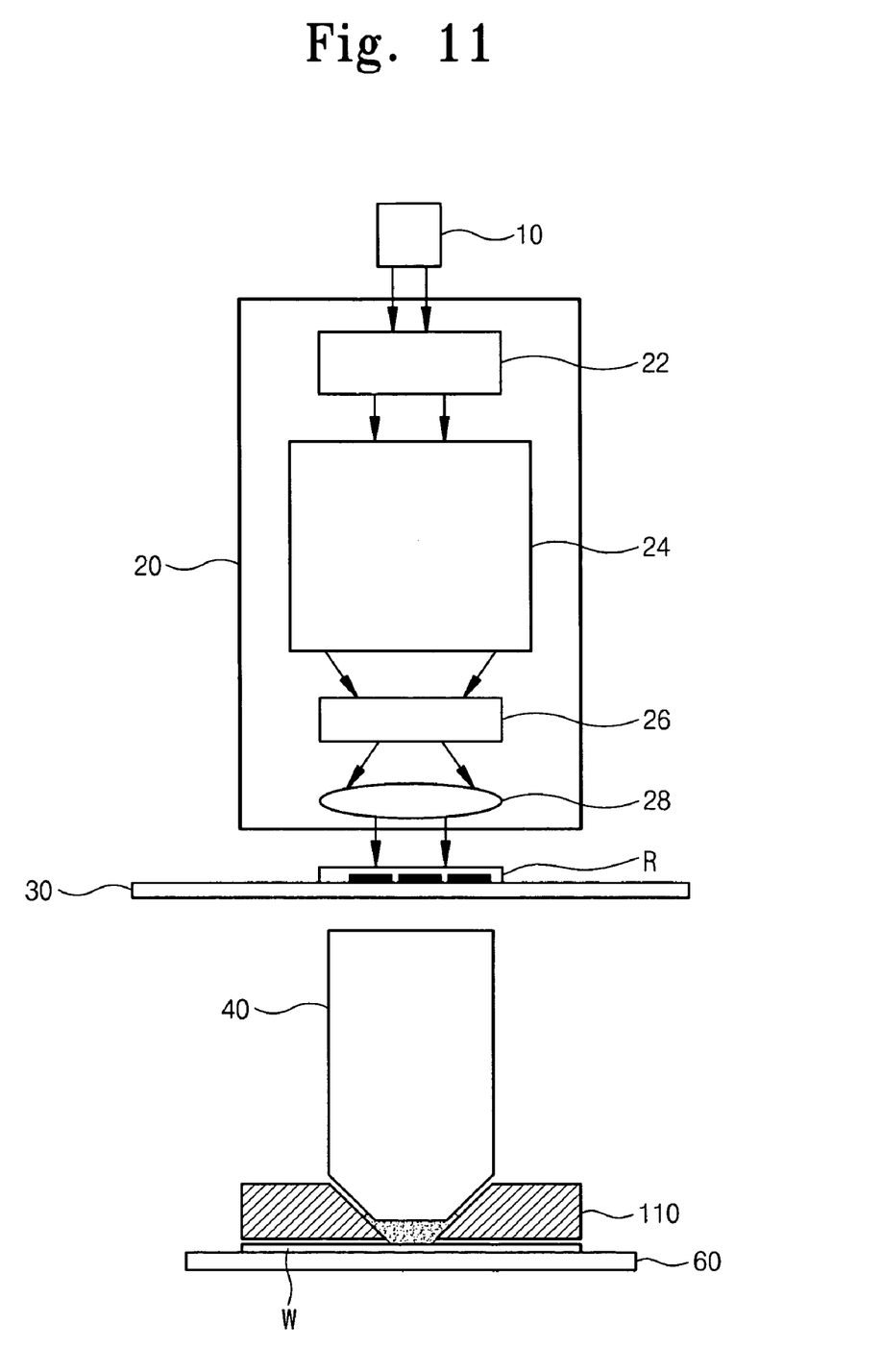
FIG. 11 illustrates a semiconductor device manufacturing apparatus according to an embodiment of the present invention.

FIG. 11 illustrates a semiconductor device manufacturing apparatus according to an embodiment of the present invention.

Referring to FIG. 11, according to the path of light, the exposure apparatus may include a light source 10, an illumination optical system 20, a reticle stage 30, a projection optical system 40, exposure apparatus units 110 and 210, and a substrate stage 60. The exposure apparatus units 110 and 210 may be exposure apparatus units 110 and 210 as described in example embodiments above and illustrated in FIGS. 1-10. A substrate (W) may be placed on the substrate stage 60, and a reticle (R) may be placed on the reticle stage 30.

The light source 10 may provide light for exposure. The light source 10 may be a mercury lamp, an argon fluoride (ArF) laser, a krypton fluoride (KrF) laser, an extreme ultraviolet beam, or an electron beam, for example. The light source 10 may be connected to the illumination optical system 20.

The illumination optical system 20 may transmit light generated from the light source 10 to the reticle (R). The illumination optical system 20 may, for example, include a light intensity distribution control member 22, a light intensity control member 24, a blind member 26, and a condenser lens 28. The light intensity distribution control member 22 may improve uniformity of the light generated by the light source 10. The light intensity control member 24 controls a coherence factor, a. The blind member 26 blocks a portion of the light to define an illumination region on the reticle (R). Accordingly, during exposure, the blind member 26 may be used to restrict the illumination region and prevent unnecessary exposure of regions.

Light that passes through the illumination optical system 20 may be radiated on the reticle (R) disposed on the reticle stage 30. The reticle (R) may include a plurality of circuit patterns for projection onto the substrate (W). The reticle stage 30 may be moved in a desired (or alternatively, a predetermined) direction.

The projection optical system 40 may be disposed below the reticle stage 30. The projection optical system 40 may provide light with image data of circuit patterns to the substrate (W). The projection optical system 40 may have an cylindrical shape, where the upper end of the projection optical system 40 may be adjacent to the reticle stage 30, and lower end of the projection optical system 40 may be adjacent to the substrate (W). A projection lens as described in example embodiments above and illustrated in FIGS. 1-10 may be disposed at the lower end of the projection optical system adjacent to the exposure apparatus units 110 and 210 and the substrate (W).

Figure 12:
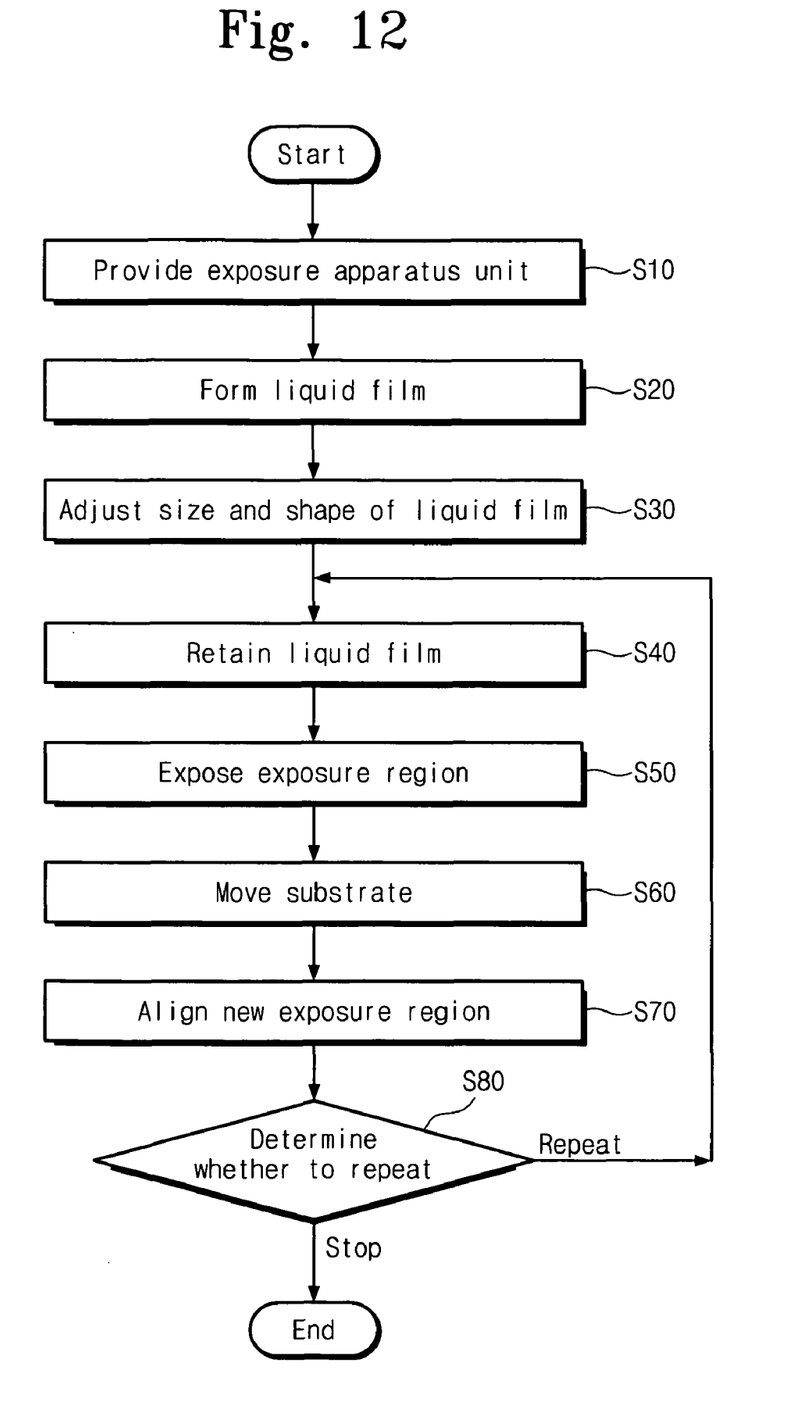
FIG. 12 illustrates a flowchart of a semiconductor device manufacturing method according to an embodiment of the present invention.

FIG. 12 illustrates a flowchart of a semiconductor device manufacturing method according to an embodiment of the present invention.

Referring to FIG. 12, an exposure apparatus unit, which is included in an exposure apparatus such as shown in FIG. 11, may be provided (S10). A substrate coated with a photoresist may be positioned on the substrate stage of the exposure apparatus.

A liquid film (LF) may be formed on the substrate using the liquid supplying portion (S20) of the exposure apparatus unit. For example, liquid may be provided through the liquid inlet of the liquid supplying portion to the space between the substrate and the projection lens. The liquid provided from the liquid inlet of the exposure apparatus unit may be supplied along the surface of the projection lens. Thus, the space between the substrate and the projection lens may be filled with an LF, and the LF may be proximately defined in its borders by the surface of the exposure apparatus unit. Liquid that may be supplied in excess may be discharged through the liquid outlet of the liquid supplying portion of the exposure apparatus unit to maintain the LF at a uniform volume.

Initially, the shape of the LF may be proximately defined according to the configuration of the liquid supplying portion of the exposure apparatus unit. For example, if the liquid supplying portion is circular, the LF may be proximately defined in a circular shape, and if the liquid supplying portion is rectangular, the LF may be proximately defined in a rectangular shape. Also, because the outer perimeter of the liquid supplying portion may be larger than the exposure region (ER), the initial size of the LF proximately defined by the liquid supplying portion may be greater than the ER. Accordingly, when a typical exposure process is performed, non-exposed regions may be cooled by the LF. Thus, when exposure processes are repeated, the substrate may be cooled non-uniformly because the degrees of LF overlap by exposure region are different from one another. This may deform the surface of the substrate, and may induce different surface states on different exposure regions of the substrate. Moreover, the exposure regions of the substrate may be rectangular. For example, in this case, the rectangular exposure region overlaps with the circular LF, which may result in localized surface differences within a common exposure region.

The size and shape of the LF are adjusted (S30). Gas may be discharged toward the boundaries of the LF. The locations at which the gas is sprayed may be controlled by adjusting the angles of the gas supplying units. For example, when gas is sprayed from the gas supplying units to the farthest boundary positions of the LF, the angles between the surface of the projection lens and the gas supplying units may be reduced. For example, the angles between the surface of the projection lens and the gas supplying units may be reduced to 0°. Conversely, when gas is sprayed from the gas supplying units to the closest boundary positions of the LF, the angles between the surface of the projection lens and the gas supplying units may be increased. For example, the gas supplying units may be rotated from an angle of 0° to an angle of 90° with respect to the surface of the projection lens. The gas spraying pressure of the gas supplying units may also be adjusted. The boundaries of the LF may be proximately defined by the positions to which the sprayed gas reaches. Because the liquid may not extend beyond the point to which pressurized gas reaches, the pressure of the sprayed gas may be made different for each region of the LF. For example, the smaller the size of the LF, the higher the pressure of the gas to be sprayed. The discharged gas may be expelled to the outside through the gas outlet of the exposure apparatus unit, or through passages between the exposure apparatus unit and the substrate.

Thus, the size and/or shape of the LF may be controlled. The angle of the gas supplying unit may be adjusted using the rotating driver, and the pressure at the gas supplying unit may be adjusted using the pressure regulator. Therefore, a common exposure apparatus unit may be used to form liquid films of different sizes. Furthermore, the angles and pressures of the gas supplying units may be preset.

The adjusted LF may be maintained (S40) during an exposure process. For example, to maintain the LF, the quantity of liquid supplied through the liquid supplying portion may be adjusted, and the pressure and angles of gas supplied through the gas supplying units may be adjusted and/or maintained. An exposure region of the substrate may be exposed through the adjusted LF (S50). Also, the substrate may be moved to expose a new exposure region (S60). Because the boundaries of the LF may be maintained by the gas from the gas supplying units, even when the substrate is moved at a fast speed, liquid may be prevented from being displaced from the LF. Accordingly, the substrate may be moved and an LF may be formed on the new exposure region (S70). This process may be repeated, and exposure of the entire substrate may be performed (S80). Thus, the time duration for the exposure process may be reduced, and degradation characteristics of morphology of the substrate may be prevented.

Figure 13:
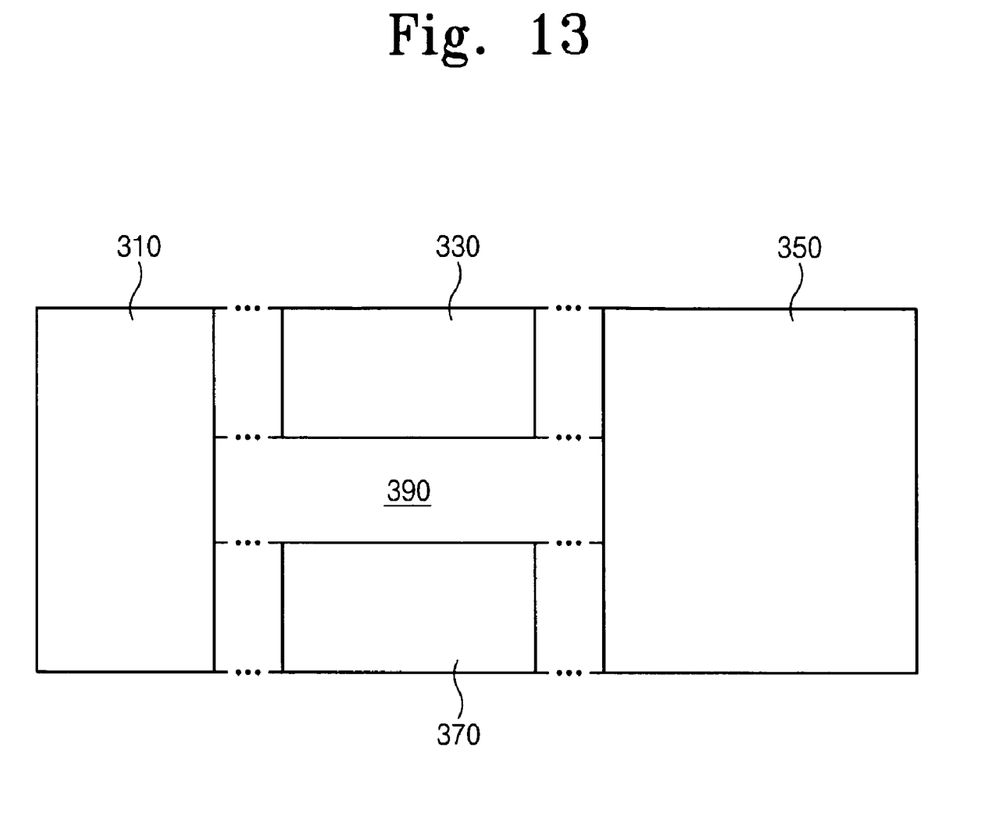
FIG. 13 illustrates a processing diagram including a semiconductor manufacturing apparatus according to an embodiment of the present invention.

FIG. 13 illustrates a processing diagram including a semiconductor manufacturing apparatus according to an embodiment of the present invention.

Referring to FIG. 13, a loading portion 310 of a substrate is provided. The loading portion 310 may be connected to a coating portion 330 for a substrate. The coating portion 330 may include, for example, a spin coating apparatus. A photoresist may be formed on the substrate by the coating apparatus. The coating portion 330 may be connected to an exposure portion 350. The exposure portion 350 may include an exposure apparatus as described above and may selectively expose the photoresist. The exposure portion 350 may be connected to a developing portion 370. The photoresist may be selectively removed in the developing portion 370 to form a desired (or alternatively a predetermined) pattern on the substrate.

A moving portion 390 to move a substrate to each chamber may be disposed at the center of each chamber, respectively, and a cleaning portion (not shown) and a baking portion (not shown) may selectively be introduced.

Changes in surface characteristics as a result of the exposure region in a substrate may be reduced or prevented through the exposure portion 350. Accordingly, even when a multilayer pattern is formed on a substrate through repeating a photolithography process, alignment problems of a substrate, induced by morphology characteristics, may be prevented.

According to an example embodiment of the present invention, an emulsion hood may be provided with a rotatable liquid inlet to easily control a liquid film formed on a substrate. According to an embodiment, the speed at which a substrate may be moved in an exposing process may be increased, and morphology differences of substrates may be reduced. Thus, the time required for an exposure process may be reduced, and reliability of manufactured semiconductor devices may be improved.

The above-disclosed subject matter is to be considered illustrative, and not restrictive, and the appended claims are intended to cover all such modifications, enhancements, and other embodiments, which fall within the true spirit and scope of the present invention as understood by those of skill in the art. Thus, to the maximum extent allowed by law, the scope of the present invention is to be determined by the broadest permissible interpretation of the following claims and their equivalents, and shall not be restricted or limited by the foregoing detailed description.

What is claimed is:

1. An apparatus for manufacturing a semiconductor device, comprising:
   a projection lens;
   a liquid supplying portion proximate to the projection lens, the liquid supplying portion forming a liquid film on a substrate facing the projection lens; and
   a gas supplying unit proximate to the liquid supplying portion, the gas supplying unit adjusting a shape and a size of the liquid film, the gas supplying unit configured to supply a plurality of air knives at respective angles, the size and the shape of the liquid film being controlled by the respective angles of the plurality of air knives.

2. The apparatus of claim 1, wherein the gas supplying unit adjusts at least one of the shape and the size of the liquid film to correspond to a shape and a size of an exposure region of the substrate.

3. The apparatus of claim 2, wherein the liquid supplying portion and the gas supplying unit are included in a common unitary apparatus, and the gas supplying unit encloses a periphery of the projection lens.

4. The apparatus of claim 2, wherein the liquid supplying portion and the gas supplying unit are included in mutually different unitary apparatuses, wherein the liquid supplying portion is mounted at a side surface of the projection lens, and the gas supplying unit encloses a periphery of the projection lens.

5. The apparatus of claim 1, wherein the plurality of air knives face the substrate, and rotates within a range of the angle from about 0° to 90° in relation to a surface of the projection lens.

6. The apparatus of claim 1, wherein a shape of the gas supplying unit corresponds to a shape of an exposure region of the substrate.

7. The apparatus of claim 1, wherein a shape of the liquid supplying portion corresponds to a shape of an exposure region of the substrate.

8. The apparatus of claim 1, further comprising:
   a projection optical system including the projection lens;
   a light source supplying light to the projection optical system; and
   a reticle stage interposed between the light source and the projection optical system.

9. The apparatus of claim 8, further comprising:
   an exposure portion including the light source, the reticle stage, and the projection optical system;
   a coating portion connected to the exposure portion; and
   a developing portion connected to the exposure portion, wherein the exposure portion includes at least one of the liquid supplying portion, and the gas supplying unit.

10. An apparatus for manufacturing a semiconductor device, comprising:
    projection lens;
    a liquid supplying portion having a first shape, the liquid supplying portion including a liquid inlet and a liquid outlet; and
    a gas supplying unit configured to adjust a shape of a portion of a liquid film to a second shape, the gas supplying unit including at least one air knife, the second shape controlled by a supply angle of the air knife.

11. The apparatus of claim 10, wherein the first shape and the second shape correspond to a shape of an exposure region of the substrate.

12. The apparatus of claim 11, wherein the first shape and the second shape are the same.

13. The apparatus of claim 12, wherein the first shape is circular.

14. The apparatus of claim 12, wherein the first shape is rectangular.

* * * * *